United States Patent
Lee et al.

(10) Patent No.: US 8,975,693 B2
(45) Date of Patent: Mar. 10, 2015

(54) METAL OXIDE SEMICONDUCTOR DEVICES WITH MULTIPLE DRIFT REGIONS

(71) Applicant: Samsung Electronics Co., Ltd., Suwon-si (KR)

(72) Inventors: Eung-Kyu Lee, Seoul (KR); Jae-June Jang, Hwaseong-si (KR); Hoon Chang, Hwaseong-si (KR); Min-Hwan Kim, Hwaseong-si (KR); Sung-Ryoul Bae, Hwaseong-si (KR); Dong-Eun Jang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/683,505

(22) Filed: Nov. 21, 2012

(65) Prior Publication Data

US 2013/0256794 A1    Oct. 3, 2013

(30) Foreign Application Priority Data

Mar. 29, 2012   (KR) .................. 10-2012-0032504

(51) Int. Cl.
*H01L 29/78* (2006.01)
*H01L 29/66* (2006.01)
*H01L 29/08* (2006.01)
*H01L 29/10* (2006.01)
*H01L 29/06* (2006.01)

(52) U.S. Cl.
CPC ...... *H01L 29/7816* (2013.01); *H01L 29/66681* (2013.01); *H01L 29/0878* (2013.01); *H01L 29/1095* (2013.01); *H01L 29/0653* (2013.01); *H01L 29/0696* (2013.01)

USPC .......................................... 257/335; 257/339

(58) Field of Classification Search
CPC ..................................... H01L 29/7816
USPC ................................... 257/335, 339
See application file for complete search history.

(56) References Cited

U.S. PATENT DOCUMENTS

2012/0094457 A1* 4/2012 Gabrys ..................... 438/286
2012/0175673 A1* 7/2012 Lee ............................ 257/140

FOREIGN PATENT DOCUMENTS

| JP | 08-097411 A | 4/1996 |
|---|---|---|
| KR | 10-2007-0071030 A | 7/2007 |
| KR | 10-0790742 B1 | 12/2007 |
| KR | 10-0840653 B1 | 6/2008 |

* cited by examiner

*Primary Examiner* — Tran Tran
(74) *Attorney, Agent, or Firm* — Myers Bigel Sibley & Sajovec, P.A.

(57) ABSTRACT

A semiconductor device includes a semiconductor substrate of a first conductivity type, a buried layer a second conductivity type different from the first conductivity type on the substrate and an epitaxial layer of the second conductivity type on the buried layer. The device further includes a pocket well of the first conductivity type in the epitaxial layer, a first drift region in the epitaxial layer at least partially overlapping the pocket well, a second drift region in the epitaxial layer and spaced apart from the first drift region, and a body region of the first conductivity type in the pocket well. A gate electrode is disposed on the body region, the pocket well and the first drift region and has an edge overlying the epitaxial region between the first and second drift regions.

20 Claims, 14 Drawing Sheets

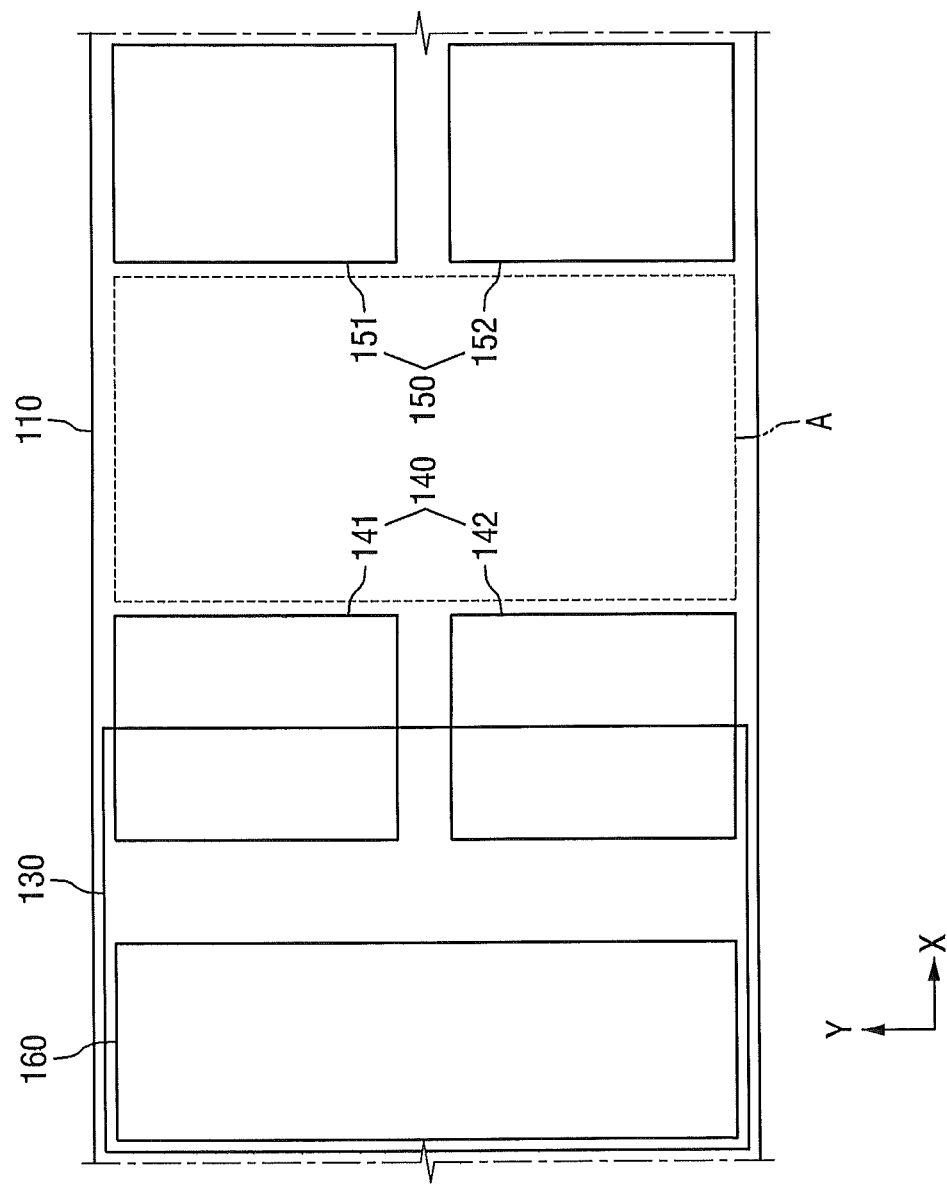

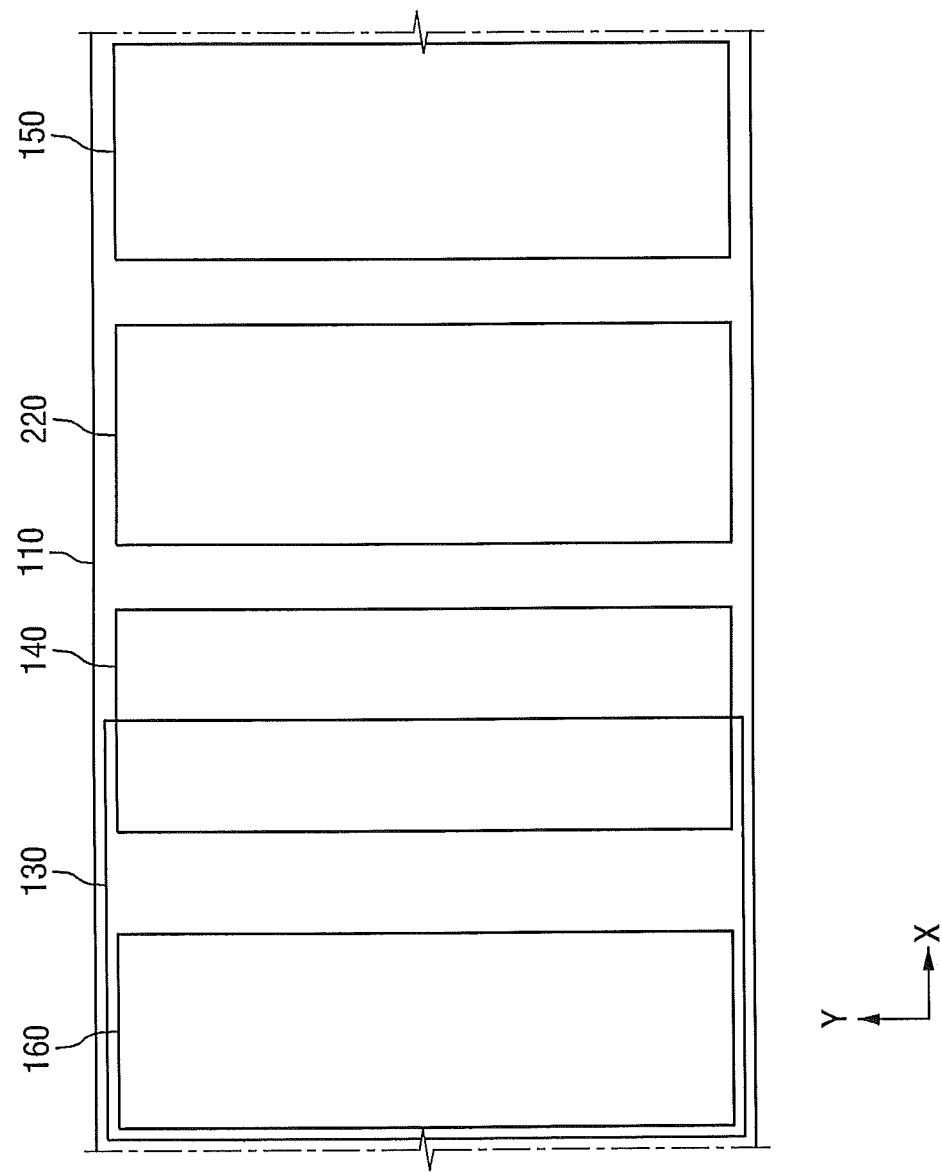

METAL OXIDE SEMICONDUCTOR DEVICES WITH MULTIPLE DRIFT REGIONS

This application claims priority from Korean Patent Application No. 10-2012-0032504 filed on Mar. 29, 2012 in the Korean Intellectual Property Office, the disclosure of which is incorporated herein by reference in its entirety.

BACKGROUND

The inventive subject matter relates to semiconductor devices and methods of fabricating the same and, more particularly, to power transistors and methods of fabricating the same.

A semiconductor system, such as a system on chip (SOC), a microcontroller unit (MCU) or a display driver IC (DDI), may include a plurality of devices, such as a processor, memory, logic circuits, audio and image processing circuits, and various interface circuits. Such semiconductor systems may also include one or more power transistors. Such a power transistor may be implemented as a double diffused metal oxide semiconductor (DMOS) or a drain extended MOS (DEMOS).

SUMMARY

According to some embodiments of the inventive subject matter, a semiconductor device includes a semiconductor substrate of a first conductivity type, a buried layer of a second conductivity type different from the first conductivity type on the substrate and an epitaxial layer of the second conductivity type on the buried layer. The device further includes a pocket well of the first conductivity type in the epitaxial layer, a first drift region in the epitaxial layer at least partially overlapping the pocket well, a second drift region in the epitaxial layer and spaced apart from the first drift region, and a body region of the first conductivity type in the pocket well. A gate electrode is disposed on the body region, the pocket well and the first drift region and has an edge overlying the epitaxial region between the first and second drift regions.

In some embodiments, the gate electrode may overlap the body region and the first drift region but not overlap the second drift region. In some embodiments, the second drift region may not overlap the pocket well.

The device may further include a well of the second conductivity type in the second drift region and a drain region in the well of the second conductivity type. The device may also include a source region in the body region and the gate electrode may be disposed on the body region.

In some embodiments, the second drift region may be separated from the first drift region in a first direction, and the first drift region may include at least two regions separated in a second direction different from the first direction. The second drift region may include at least two regions separated in the second direction.

In some embodiments, the device may include a third drift region in the epitaxial layer and separated from the first and second drift regions. The third drift region may be disposed between the first and second drift regions. In some embodiments, the gate electrode may not overlap the second and third drift regions.

In some embodiments, the device may include an element isolation film in the epitaxial layer between the first and second drift regions. The edge of the gate electrode may be disposed on the element isolation film.

According to some embodiments of the inventive subject matter, a semiconductor device includes a semiconductor substrate having a epitaxial layer, a source region of a first conductivity type impurity and a drain region of the first conductivity type impurity on the semiconductor substrate, a gate electrode between the source region and the drain region, and wherein the drain region is formed in a drift region, and the epitaxial layer has a valley region which has a lower impurity concentration than the drift region.

Still further embodiments of the inventive subject matter provide a semiconductor device including a semiconductor substrate, a buried layer on the substrate and an epitaxial layer on the buried layer. The device further includes a pocket well in the epitaxial layer and a plurality of spaced apart drift regions in the epitaxial layer. A body region is disposed in the pocket well and a gate electrode overlaps the body region and the at least one drift region but not all of the plurality of drift regions. The device may include at least one isolation region disposed in the epitaxial layer between adjacent ones of the drift regions.

BRIEF DESCRIPTION OF THE DRAWINGS

The above and other aspects and features of the inventive subject matter will become more apparent by describing in detail exemplary embodiments thereof with reference to the attached drawings, in which:

FIG. 6 is a conceptual layout diagram of a semiconductor device according to some embodiments of the inventive subject matter;

FIG. 7B is a conceptual layout diagram of the semiconductor device shown in FIG. 7A;

DETAILED DESCRIPTION

Figure 1:
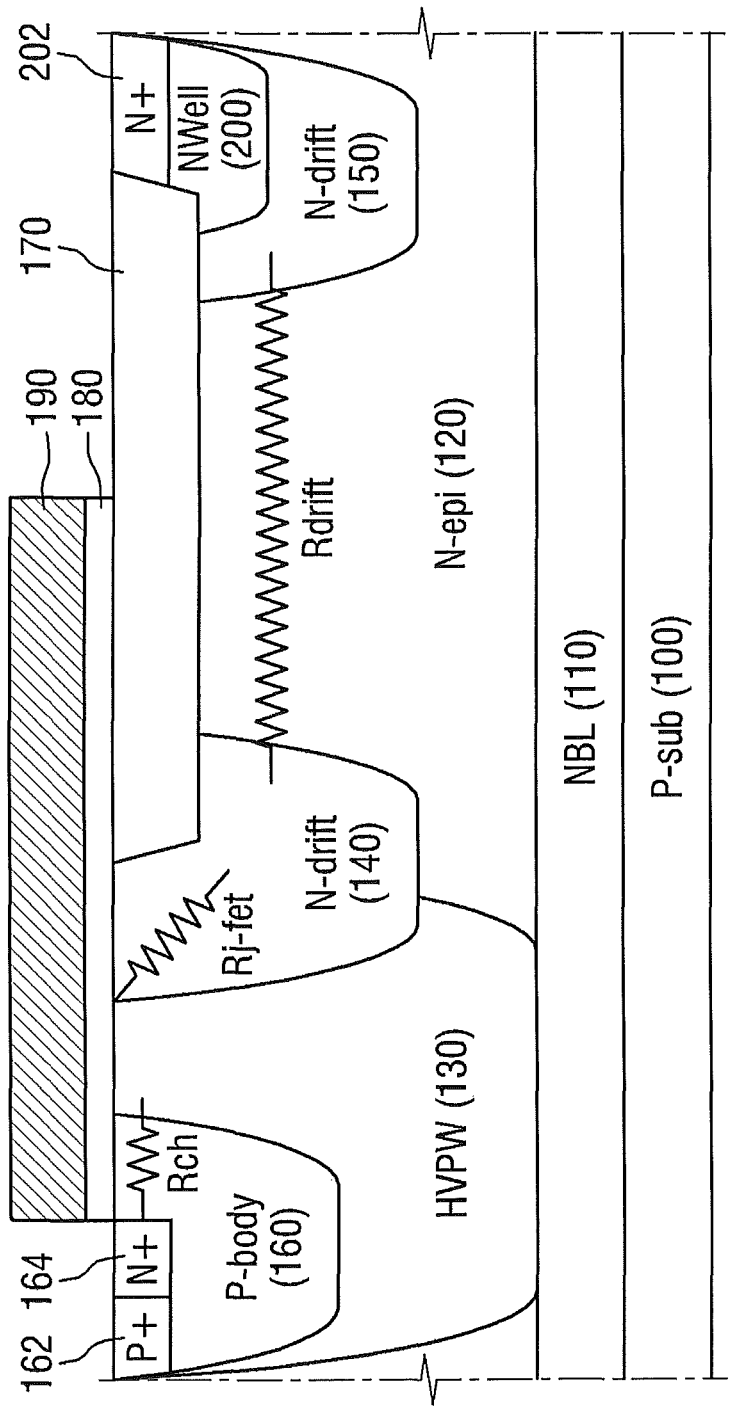
FIG. 1 is a cross-sectional view of a semiconductor device according to some embodiments of the inventive subject matter.

Advantages and features of the inventive subject matter and methods of accomplishing the same may be understood more readily by reference to the following detailed description of preferred embodiments and the accompanying drawings. The inventive subject matter may, however, be embodied in many different forms and should not be construed as being limited to the embodiments set forth herein. Rather, these embodiments are provided so that this disclosure will be thorough and complete and will fully convey the concept of the invention to those skilled in the art, and the inventive subject matter will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the inventive subject matter.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Figure 2:
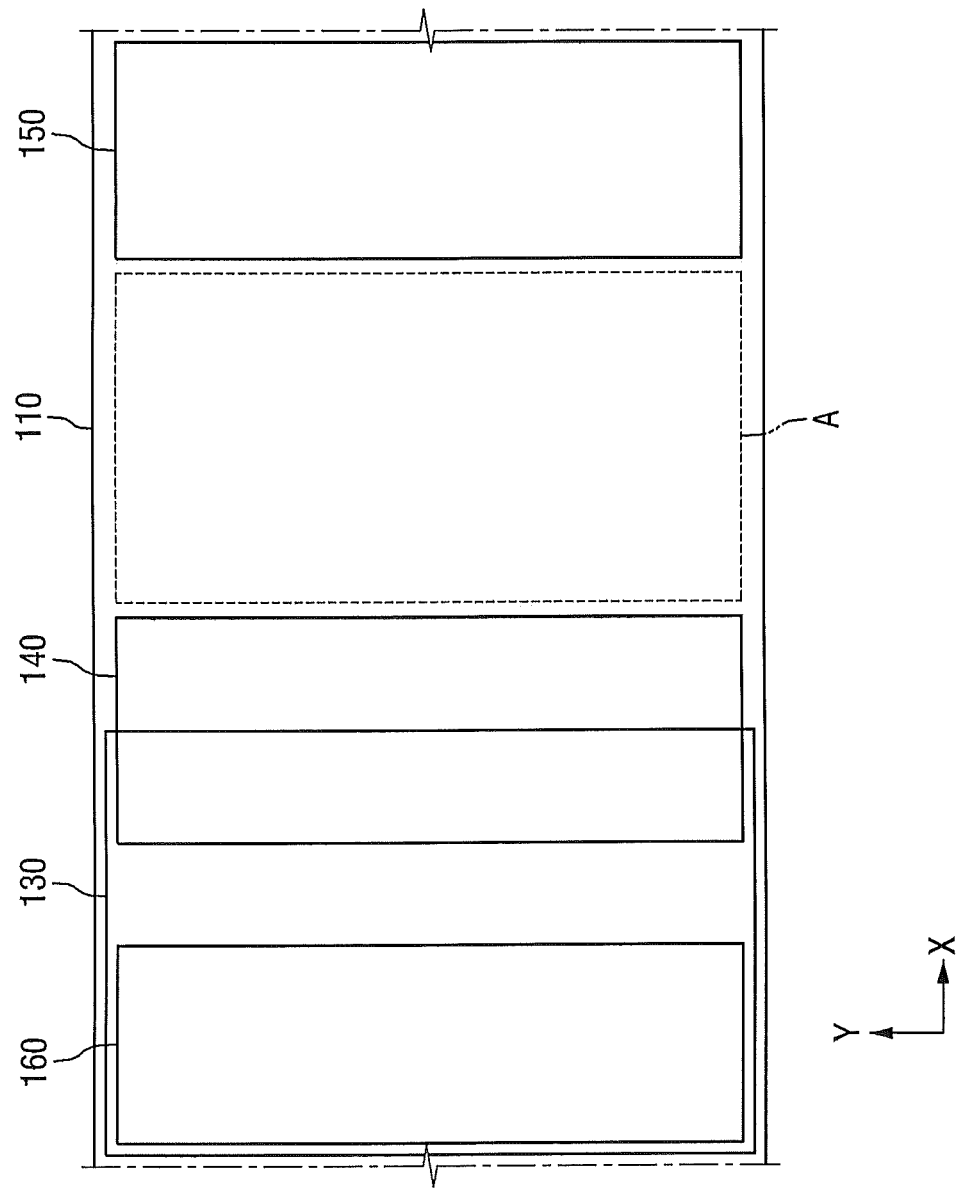
FIG. 2 is a layout diagram of the semiconductor device shown in FIG. 1.

FIG. 1 is a cross-sectional view of a semiconductor device according to some embodiments of the inventive subject matter. FIG. 2 is a conceptual layout diagram of the semiconductor device shown in FIG. 1.

Hereinafter, devices that may be characterized as double diffused metal oxide semiconductor (DMOS) or drain extended MOS (DEMOS) will be described as examples of some embodiments of the inventive subject matter. However, semiconductor devices according to some embodiments of the inventive subject matter are not limited to the examples described below.

Referring to FIGS. 1 and 2, a buried layer 110 may be formed on a substrate 100 of the semiconductor device. The substrate 100 may be a semiconductor substrate of a first conductivity type (e.g., a P type). The substrate 100 may be a silicon substrate, a gallium arsenide substrate, a silicon germanium substrate, a ceramic substrate, a quartz substrate or a glass substrate for displays or may be a semiconductor on insulator (SOI) substrate.

The buried layer 110 of a second conductivity type (e.g., an N type) may be formed on the substrate 100. In some embodiments of the inventive subject matter, the buried layer 110 of the second conductivity type (e.g., N type) may be formed in and on the substrate 100. The buried layer 110 may be formed at a boundary between the substrate 100 and an epitaxial layer 120.

To form a portion of the buried layer 110 in the substrate 100 and the other portion of the buried layer 110 in the epitaxial layer 120, the buried layer 110 may be formed in the substrate 100, and the epitaxial layer 120 may be formed on the substrate 100. Then, a heat treatment process may be performed. The heat treatment process may cause the buried layer 110 to diffuse into the substrate 100 and the epitaxial layer 120. As a result, a portion of the buried layer 110 may be formed in the substrate 100, and the other portion of the buried layer 110 may be formed in the epitaxial layer 120.

The epitaxial layer 10 may be formed on the buried layer 110. A pocket well 130, a first drift region 140, a second drift region 150, and an element isolation film 170 may be formed in the epitaxial layer 120. In the illustrated embodiments, the epitaxial layer 120 may have the second conductivity type (e.g., N type).

The pocket well 130 of the first conductivity type (e.g., P type) may contact the buried layer 110. In the illustrated embodiments, the pocket well 130 may be, but is not limited to, a high-voltage pocket well (HVPW). In some embodiments of the inventive subject matter, the pocket well 130 may not contact the buried layer 110.

The pocket well 130 may include a body region 160 of the first conductivity type (e.g., P type). The body region 160 may include an ohmic contact 162 to which a bias voltage is applied and a source region 164 of a DMOS transistor. When the DMOS transistor according to the illustrated embodiments has the second conductivity type (e.g., N type), the ohmic contact 162 and the body region 160 may have the first conductivity type (e.g., P type), and the source region 164 may have the second conductivity type (e.g., N type).

The first drift region 140 may be formed in the epitaxial layer 120 to overlap the pocket well 130 as shown in the drawings. The first drift region 140 may be shallower than the pocket well 130. The first drift region 140 may not contact the buried layer 110.

In the illustrated embodiments, the first drift region 140 may contact only a minimum area of the pocket well 130 as long as it does not deteriorate breakdown voltage (BV) characteristics of the DMOS transistor. Accordingly, on-resistance (Ron) of the DMOS transistor may decrease. This will be described in detail later. When the DMOS transistor according to the illustrated embodiments has the second conductivity type (e.g., N type), the first drift region 140 may have the second conductivity type (e.g., N type).

The second drift region 150 may be formed in the epitaxial layer 12 and separated from the first drift region 140 as shown in the drawings. In some embodiments of the inventive subject matter, the second drift region 150 may not overlap the pocket 130 as shown in the drawing. The second drift region 150 may have the same conductivity type as the first drift region 140. For example, when the DMOS transistor according to the illustrated embodiments has the second conductivity type (e.g., N type), the first and second drift regions 140 and 150 may have the second conductivity type (e.g., N type). The second drift region 150 may be formed in the epitaxial layer 120 to a depth substantially equal to that of the first drift region 140.

The second drift region 150 may include a well 200 of the second conductivity type (e.g., N type). A drain 202 may be formed in the well 200 of the second conductivity type (e.g., N type). When the DMOS transistor has the second conductivity type (e.g., N type), the drain region 202 may have the second conductivity type (e.g., N type).

Referring again to FIGS. 1 and 2, the element isolation film 170 may be formed in the epitaxial layer 120 to overlap both of the first and second drift regions 140 and 150. Specifically, the first and second drift regions 140 and 150 may be separated from each other by the element isolation film 170 formed in the epitaxial layer 120. The separation of the first and second drift regions 140 and 150 may change the concentration distribution of carriers in a drift region of the DMOS transistor according to the illustrated embodiments and reduce the overall concentration of the carriers. Therefore, the separated first and second drift regions 140 and 150 according to the illustrated embodiments can reduce the on-resistance of the DMOS transistor. This will be described in detail later.

In some embodiments of the inventive subject matter, the element isolation film 170 may be made of an insulating film. In some other embodiments of the inventive subject matter, the element isolation film 170 may be replaced by a film with a different function or may be omitted.

A gate insulating film 180 and a gate electrode 190 may be formed on the substrate 100 and the epitaxial layer 120. The gate insulating film 180 may be made of a high-k film, and the gate electrode 190 may be a polysilicon gate electrode or a metal gate electrode.

An edge of the gate electrode 190 may be disposed on the epitaxial layer 120 (in a region A) between the first and second drift regions 140 and 150. Specifically, an edge of the gate electrode 190 may not be disposed on the first and second drift regions 140 and 150 but may be disposed on the epitaxial layer 120 (in the region A) between the first and second drift regions 140 and 150. More specifically, an edge of the gate electrode 190 may not be disposed on the first and second drift regions 140 and 150 but may be disposed on a portion of the element isolation film 170 which does not overlap the first and second drift regions 140 and 150.

When an edge of the gate electrode 190 is disposed on the epitaxial layer 120 (in the region A) between the first and second drift regions 140 and 150 as described above, an electric field distribution generated while the DMOS transistor is being driven can be prevented from deteriorating the BV characteristics of the DMOS transistor. In other words, in the illustrated embodiments, an edge of the gate electrode 190 is disposed on the epitaxial layer 120 (in the region A) between the first and second drift regions 140 and 150 to generate an electric field distribution that does not deteriorate the BV characteristics of the DMOS transistor. Meanwhile, another edge of the gate electrode 190 may be disposed on the body region 160 to be adjacent to the source region 164.

Referring to FIG. 1, the on-resistance Ron of a semiconductor device (e.g., the DMOS transistor) according to the illustrated embodiments may be defined by Equation (1) below:

$$Ron = Vds/Ids = Rch + Rj\text{-}fet + Rdrift + Rs + Rd, \quad (1)$$

where Rch is channel resistance between the body region 160 and the pocket well 130, Rj–fet is resistance in a junction area in which the pocket well 130 of the first conductivity type (e.g., P type) overlaps the first drift region 140 of the second conductivity type (e.g., N type), Rdrift is resistance generated while carriers drift in the first and second drift regions 140 and 150, and Rs and Rd are resistance of the source region 164 and resistance of the drain region 202, respectively.

In a semiconductor device according to the illustrated embodiments, the first drift region 140 and the second drift region 150 are separated from each other, as described above. Therefore, a larger depletion area is formed than in devices in which the first drift region 140 and the second drift region 150 are not separated. The larger depletion area may reduce Rdrift without deteriorating the BV characteristics of the DMOS transistor. In addition, an overlap area between the first drift region 140 and the pocket well 130 is smaller than when the first drift region 140 and the second drift region 150 are not separated. The reduced overlap area may reduce Rj–fet.

Furthermore, in a semiconductor device according to the illustrated embodiments, the position of the gate electrode 190 is adjusted to prevent the deterioration of the BV characteristics of the DMOS transistor, thereby forming an electric field distribution that enables the DMOS transistor to operate efficiently.

Due to these factors, in a semiconductor device according to the illustrated embodiments, the BV characteristics of the DMO transistor may be maintained while the on-resistance Ron of the DMOS transistor may be reduced. Therefore, there may be no need to increase the size of the DMOS transistor to reduce the on-resistance of the DMOS transistor. This enables the fabrication of a smaller semiconductor device with desired on-resistance.

Characteristics of a semiconductor device according to the illustrated embodiments of the inventive subject matter will now be described with reference to FIGS. 3 and 4.

Figure 3:
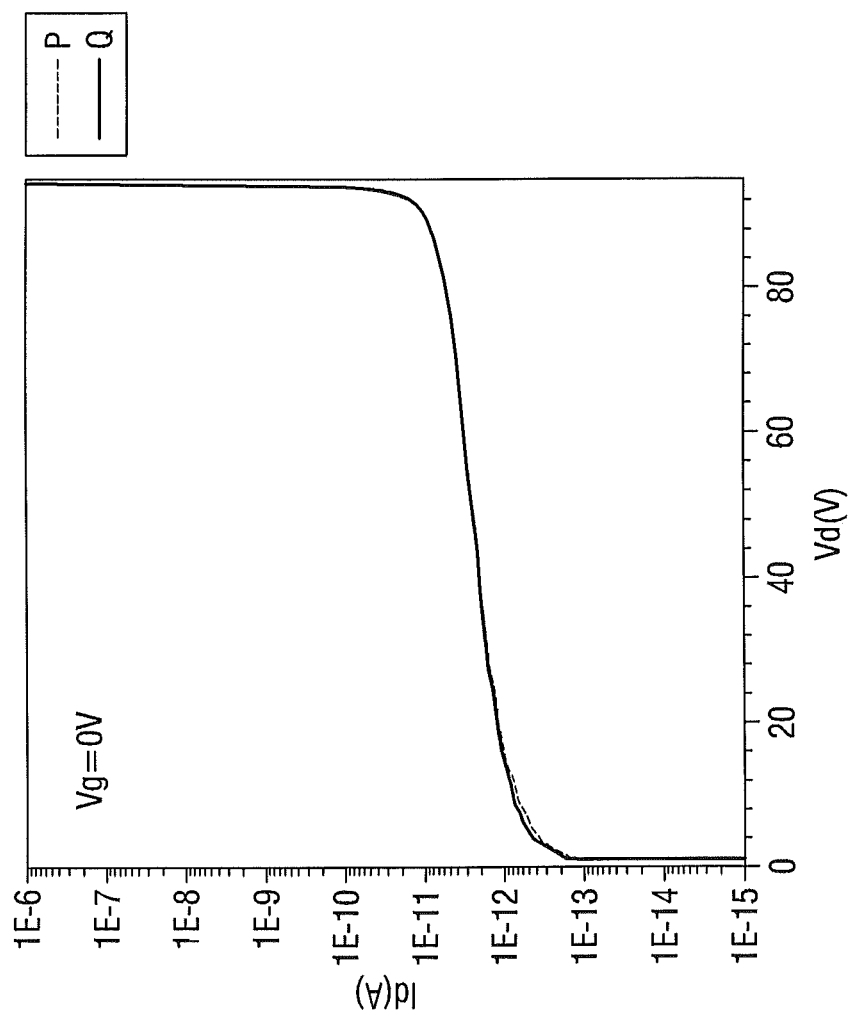
FIGS. 3 and 4 are diagrams illustrating characteristics of the semiconductor device according to some embodiments of the inventive subject matter.
Figure 4:
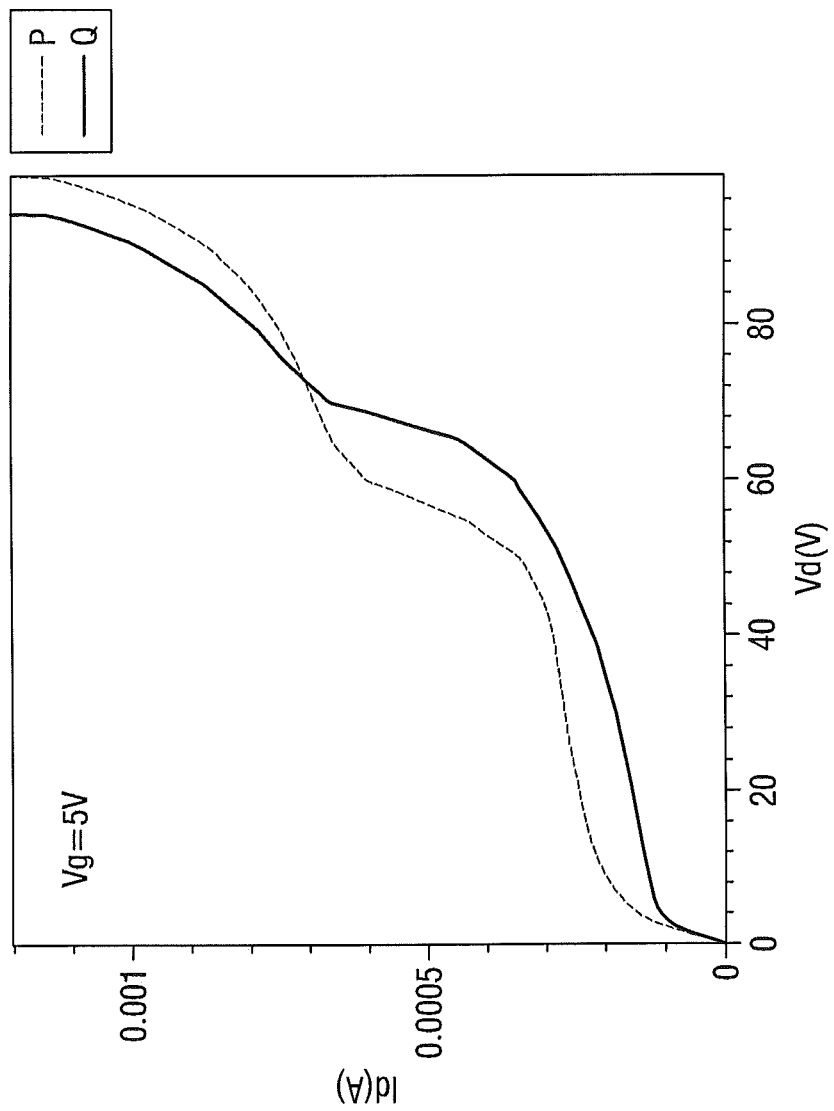

FIGS. 3 and 4 are diagrams illustrating characteristics of a semiconductor device according to some embodiments of the inventive subject matter.

FIG. 3 is a graph illustrating BV characteristics of transistors. The graph shows the variation in drain current Id with respect to drain voltage Vd in a case where 0 V is applied to a gate electrode. Here, reference character 'P' indicates a DMOS transistor in which a first drift region and a second drift region are separated as in the illustrated embodiments, and reference character 'Q' indicates a DMOS transistor in which a first drift region and a second drift region are not separated, unlike in the illustrated embodiments. Referring to FIG. 3, the DMOS transistor P in which the first drift region and the second drift region are separated has almost the same BV characteristics as a DMOS transistor Q in which the first drift region and the second drift region are not separated.

FIG. 4 is a graph illustrating on-resistance Ron characteristics of transistors. The graph shows the variation in drain current Id with respect to drain voltage Vd in a case where 5 V is applied to a gate electrode. Referring to FIG. 4, the DMOS transistor P in which the first drift region and the second drift region are separated has a greater amount of drain current Id for the same drain voltage Vd than the DMOS transistor P in which the first drift region and the second drift region are separated. Therefore, the on-resistance Ron of the DMOS transistor P in which the first drift region and the second drift region are separated is smaller than that of the DMOS transistor Q in which the first drift region and the second drift region are not separated.

Referring to FIGS. 1 and 2, the first drift region 140 and the second drift region 150 which are separated from each other can be formed using various methods. An example method of forming the separate first and second drift regions 140 and 150 using ion implantation will now be described.

Figure 5:
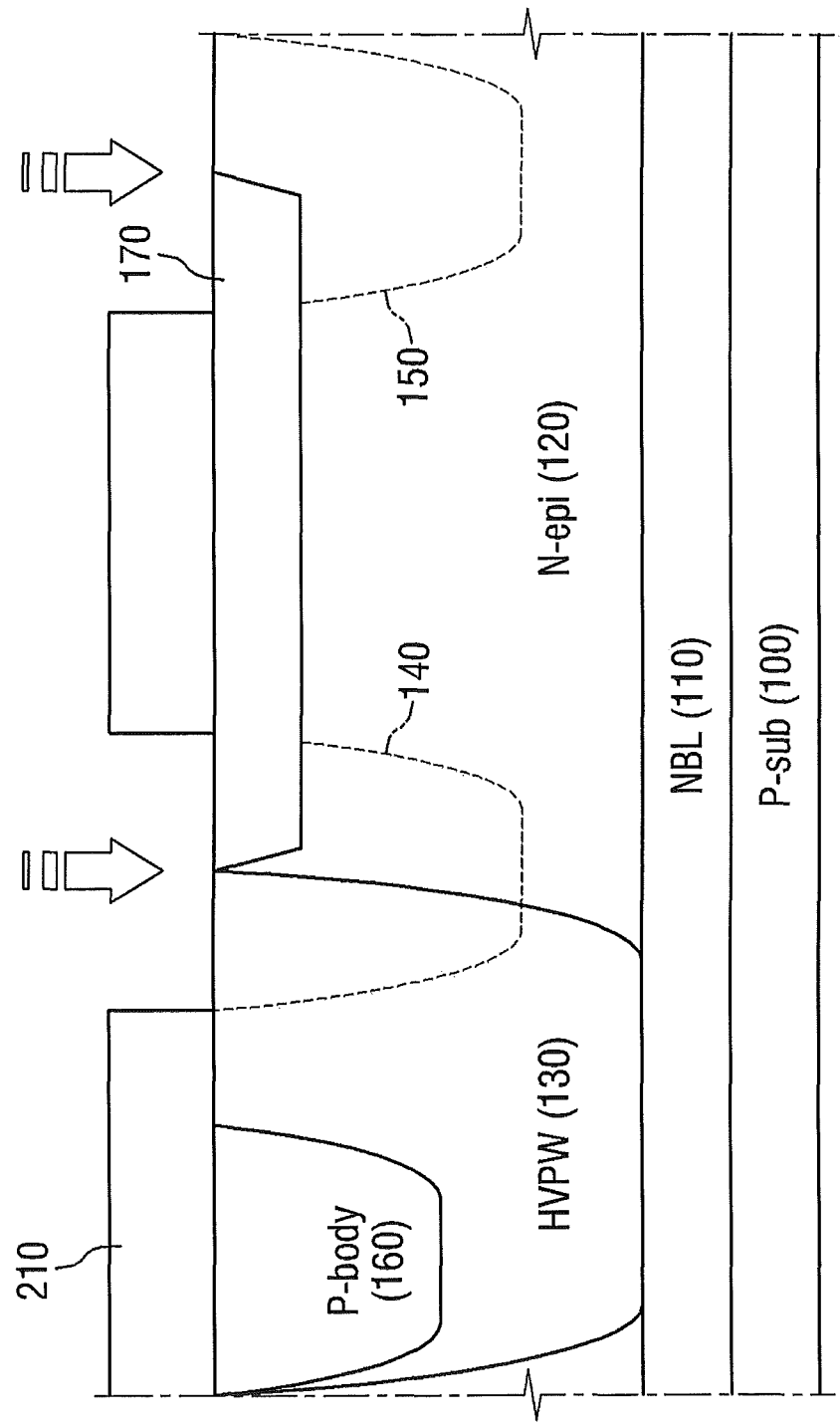
FIG. 5 is a diagram illustrating operations for fabricating a semiconductor device according to some embodiments of the inventive subject matter.

FIG. 5 is a diagram illustrating operations for fabricating a semiconductor device according to some embodiments of the inventive subject matter.

Referring to FIG. 5, a mask pattern 210 is formed on a substrate 100 having a buried layer 110 and an epitaxial layer 120 formed thereon. The mask pattern 210 may be placed to mask portions of the epitaxial layer 120 and expose portions of the epitaxial layer 120. Specifically, a pocket well 130, a body region 160, and an element isolation film 170 may be formed in the epitaxial layer 120. As shown in the drawing, the mask pattern 210 may be placed on the epitaxial layer 120 to mask the body region 160, a portion of the pocket well 130, and a portion of the element isolation film 170.

In some embodiments of the inventive subject matter, the element isolation film 170 may not be formed in the epitaxial layer 120 before the mask pattern 210 is formed, unlike the illustration in the drawing. In this case, the mask pattern may be placed on the epitaxial layer 120 to mask the body region 160, a portion of the pocket well 130, and a portion of the epitaxial layer 120.

Separate first and second drift regions 140 and 150 may be formed by implanting ions of the second conductivity type (e.g., N type) into the epitaxial layer 120 using the mask pattern 210 as a mask. An ion implantation depth may be such that the first drift region 140 and the second drift region 150 are formed to substantially the same depth, as shown in the drawing.

A semiconductor device according to some embodiments of the inventive subject matter will now be described with reference to FIG. 6, which is a conceptual layout diagram of a semiconductor device according to some embodiments of the inventive subject matter.

Referring to FIG. 6, a pocket well 130 of a first conductivity type (e.g., a P type) may be formed on a buried layer 110 of a second conductivity type (e.g., an N type). In addition, a body region 160 of the first conductivity type (e.g., P type), a first drift region 140 of the second conductivity type (e.g., N type), and a second drift region 150 of the second conductivity type (e.g., N type) may be formed on the buried layer 110. The body region 160 may completely overlap the pocket well 130, and the first drift region 140 may partially overlap the pocket well 130. The second drift region 150 may not overlap the pocket well 130 and may be separated from the first drift region 140 in a first direction (e.g., an X direction).

In the illustrated embodiments, the first drift region 140 may include a $(1-1)^{th}$ drift region 141 and a $(1-2)^{th}$ drift region 142 which overlap the pocket well 130 and are separated from each other in a second direction (e.g., a Y direction). In addition, the second drift region 150 may include a $(2-1)^{th}$ drift region 151 and a $(2-2)^{th}$ drift region 152 which do not overlap the pocket well 130 and are separated from each other in the second direction (e.g., the Y direction).

When the first drift region 140 and the second drift region 150 are separated in the first and second directions as described above, the distribution of carriers in a drift region of a DMOS transistor can be more diverse. In addition, the overall concentration of the carriers in the drift region can be changed more diversely.

Other elements of the illustrated embodiments are identical to those of the previous embodiment described above, and thus any repetitive detailed description thereof will be omitted.

Figure 7A:
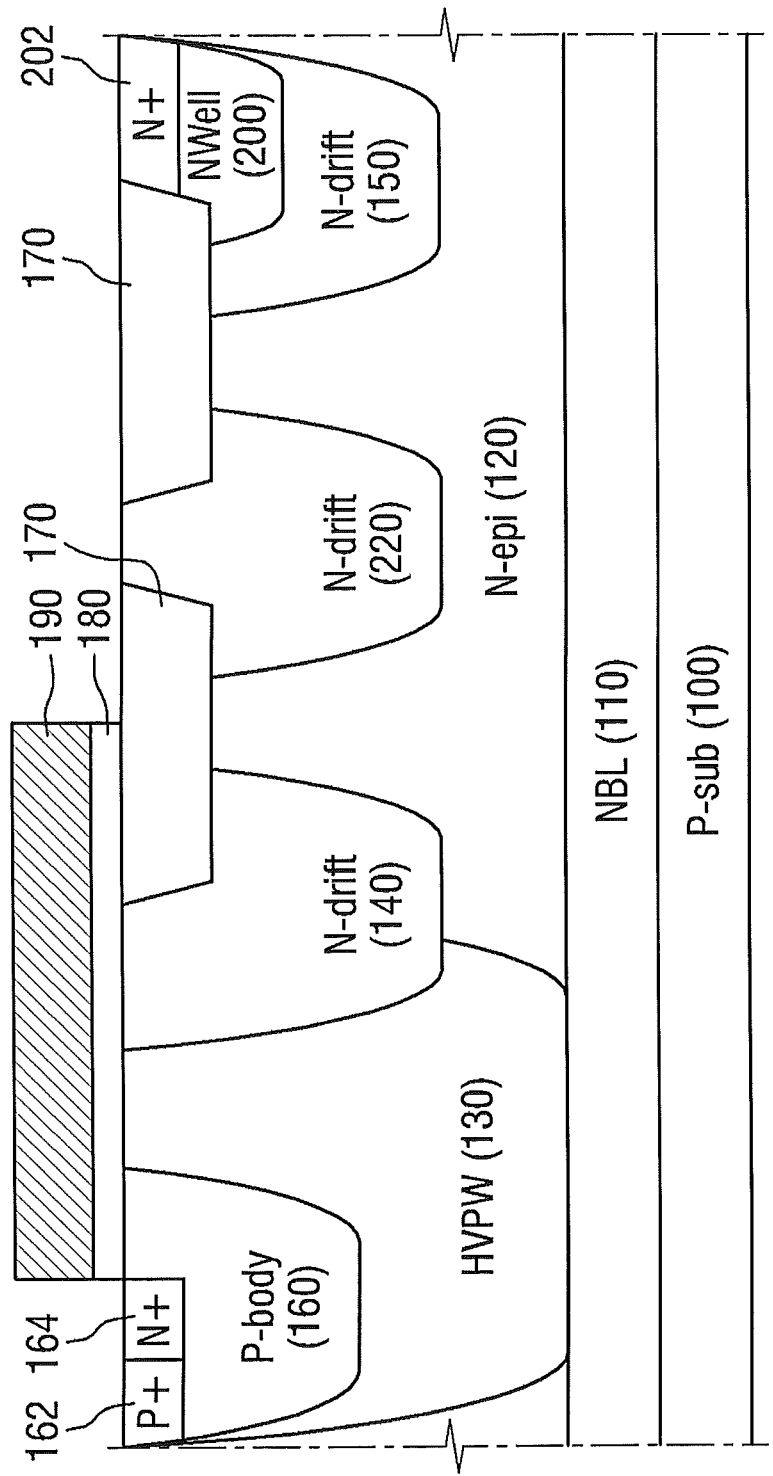
FIG. 7A is a cross-sectional view of a semiconductor device according to some embodiments of the inventive subject matter.

A semiconductor device according to some embodiments of the inventive subject matter will now be described with reference to FIGS. 7A and 7B. FIG. 7A is a cross-sectional view of a semiconductor device according to some embodiments of the inventive subject matter. FIG. 7B is a conceptual layout diagram of the semiconductor device shown in FIG. 7A.

Referring to FIGS. 7A and 7B, a buried layer 110 of a second conductivity type (e.g., an N type) may be formed on a substrate 100 of a first conductivity type (e.g., a P type) in the semiconductor device. An epitaxial layer 120 of the second conductivity type (e.g., N type) may be formed on the buried layer 110, and a pocket well 130, a first drift region 140, a second drift region 150, a third drift region 220 and an element isolation film 170 may be formed in the epitaxial layer 120.

The pocket well 130 of the first conductivity type (e.g., P type) may contact the buried layer 110. However, embodiments of the inventive subject matter are not limited thereto. The pocket well 130 may include a body region 160 of the first conductivity type (e.g., P type). The body region 160 may include an ohmic contact 162 of the first conductivity type (e.g., P type) to which a bias voltage is applied and a source region 164 of the second conductivity type (e.g., N type).

The first drift region 140 of the second conductivity type (e.g., N type) may be formed in the epitaxial layer 120 to overlap the pocket well 130 as shown in FIG. 7A. The first drift region 140 may be shallower than the pocket well 130 as shown in FIG. 7A. The first drift region 140 may not contact the buried layer 110.

The second drift region 150 of the second conductivity type (e.g., N type) may be formed in the epitaxial layer 120, separate from the first drift region 140 and the third drift region 220 in a first direction (e.g., an X direction). The second drift region 150 may not overlap the pocket well 130. The second drift region 150 may be formed in the epitaxial layer 120 to a depth substantially equal to that of the first drift region 140. The second drift region 150 may include a well 200 of the second conductivity type (e.g., N type), and a drain region 202 of the second conductivity type (e.g., N type) may be formed in the well 200 of the second conductivity type (e.g., N type).

The third drift region 220 of the second conductivity type (e.g., N type) may be formed in the epitaxial layer 120 to be separated from the first and second drift regions 140 and 150 in the first direction (e.g., the X direction). Specifically, the third drift region 220 may be disposed between the first and second drift regions 140 and 150. The third drift region 220 may not overlap the pocket well 130 and may be formed in the epitaxial layer 120 to a depth substantially equal to that of the first and second drift regions 140 and 150.

The element isolation film 170 may be formed in the epitaxial layer 120 to overlap each of the first, second and third drift regions 140, 150 and 220. However, embodiments of the inventive subject matter are not limited to this form. The form of the element isolation film 170 can be modified. In some embodiments of the inventive subject matter, the element isolation film 170 can be omitted. The first and third drift regions 140 and 220 and the second and third drift regions 150 and 220 may be separated from each other by the element isolation film 170 formed in the epitaxial layer 120.

The separation of the first, second and third drift regions 140, 150 and 220 can further change the concentration distribution of carriers in a drift region of a DMOS transistor according to the illustrated embodiments. The separation of the first, second and third drift regions 140, 150 and 220 can change the overall concentration of the carriers in the drift region more diversely. Therefore, the on-resistance of the DMOS transistor in a semiconductor device according to the illustrated embodiments may be different from those of DMOS transistors in a semiconductor devices according to the embodiments described with reference to FIGS. 1 and 2.

A gate insulating film 180 and a gate electrode 190 may be formed on the substrate 100 and the epitaxial layer 120. As shown in the drawings, an edge of the gate electrode 190 may be disposed on the epitaxial layer 120 between the first and third drift regions 140 and 220. Specifically, an edge of the gate electrode 190 may not be disposed on the first and third drift regions 140 and 220 but may be disposed on the epitaxial layer 120 between the first and third drift regions 140 and 220. More specifically, an edge of the gate electrode 190 may not be disposed on the first and third drift regions 140 and 220 but may be disposed on a portion of the element isolation film 170 which does not overlap the first and third drift regions 140 and 220. Meanwhile, the other edge of the gate electrode 190 may be disposed on the body region 160 to be adjacent to the source region 164.

In FIG. 7B, the first, second and third drift regions 140, 150 and 220 are not separate from each other in a second direction (e.g., a Y direction). However, embodiments of the inventive subject matter are not limited thereto. In some embodiments of the inventive subject matter, the first, second and third drift regions 140, 150 and 220 may be separated in the second direction (e.g., the Y direction) as shown in FIG. 6.

Figure 8:
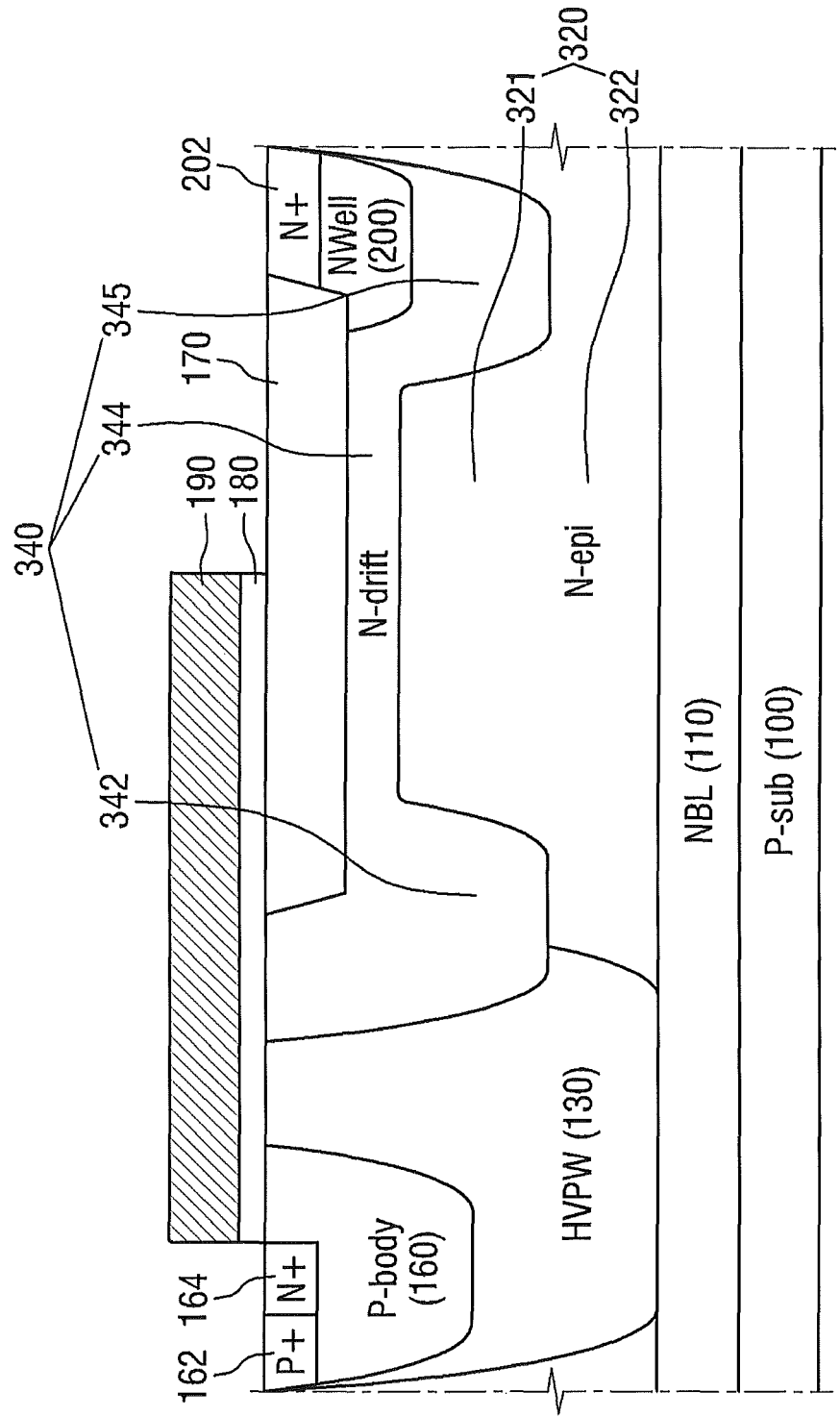
FIG. 8 is a cross-sectional view of a semiconductor device according to some embodiments of the inventive subject matter.

A semiconductor device according to some embodiments of the inventive subject matter will now be described with reference to FIGS. 8. FIG. 8 is a cross-sectional view of a semiconductor device according to some embodiments of the inventive subject matter.

Referring to FIG. 8, a buried layer 110 of a second conductivity type (e.g., an N type) may be formed on a substrate 100 of a first conductivity type (e.g., a P type) in the semiconductor device. An epitaxial layer 320 of the second conductivity type (e.g., N type) may be formed on the buried layer 110, and a pocket well 130, a drift region 340, and an element isolation film 170 may be formed in the epitaxial layer 320.

The pocket well 130 of the first conductivity type (e.g., P type) may contact the buried layer 110. However, embodiments of the inventive subject matter are not limited thereto. The pocket well 130 may include a body region 160 of the first conductivity type (e.g., P type). The body region 160 may include an ohmic contact 162 of the first conductivity type (e.g., P type) to which a bias voltage is applied and a source region 164 of the second conductivity type (e.g., N type).

The drift region 340 of the second conductivity type (e.g., N type) may be formed in the epitaxial layer 320 and include a first drift region 342, a connection region 344 and a second drift region 346. The first drift region 342 may overlap the pocket well 130 as shown in FIG. 8. The first drift region 342 may be shallower than the pocket well 130 as shown in FIG. 8. The first drift region 342 may not contact the buried layer 110.

The second drift region 346 of the second conductivity type (e.g., N type) may be formed in the epitaxial layer 320. The second drift region 346 may not overlap the pocket well 130. The second drift region 346 may be formed in the epitaxial layer 320 to a depth substantially equal to that of the first drift region 342. The second drift region 346 may include a well 200 of the second conductivity type (e.g., N type), and a drain region 202 of the second conductivity type (e.g., N type) may be formed in the well 200 of the second conductivity type (e.g., N type).

The first drift region 342 may be connected to the second drift region 346 by the connection region 344. This connection region 344 may be formed during annealing the first drift region 342 and second drift region 344. A depth of connection region 344 may be smaller than the first and second drift regions 342, 346.

The epitaxial layer 320 may include valley region 321 and base region 322. The valley region 321 which has a lower impurity concentration than the drift region 340 is formed below the connection region 344. Specifically, the valley region 321 may be formed below the connection region 344 between the first and second drift regions 342, 346 as shown in FIG. 8.

The element isolation film 170 may be formed in the epitaxial layer 320 to overlap each of the first and second drift regions 342, 346. However, embodiments of the inventive subject matter are not limited to this form. The form of the element isolation film 170 can be modified. In some embodiments of the inventive subject matter, the element isolation film 170 can be omitted.

The valley region 321 in the epitaxial layer 320 can further change the concentration distribution of carriers in a drift region of a DMOS transistor more diversely. Therefore, the on-resistance of the DMOS transistor in a semiconductor device according to the illustrated embodiments may be different from those of DMOS transistors in a semiconductor devices according to the embodiments described with reference to FIGS. 1 and 2.

A gate insulating film 180 and a gate electrode 190 may be formed on the substrate 100 and the epitaxial layer 320. As shown in the drawings, an edge of the gate electrode 190 may be disposed on the epitaxial layer 320 between the first and second drift regions 342 and 346. Specifically, an edge of the gate electrode 190 may not be disposed on the first and second drift regions 342 and 346 but may be disposed on the valley region 321 between the first and second drift regions 342 and 346. Meanwhile, the other edge of the gate electrode 190 may be disposed on the body region 160 to be adjacent to the source region 164.

A semiconductor device according to some embodiments of the inventive subject matter will now be described with reference to FIG. 9, which is a circuit diagram of a semiconductor device according to some embodiments of the inventive subject matter.

Figure 9:
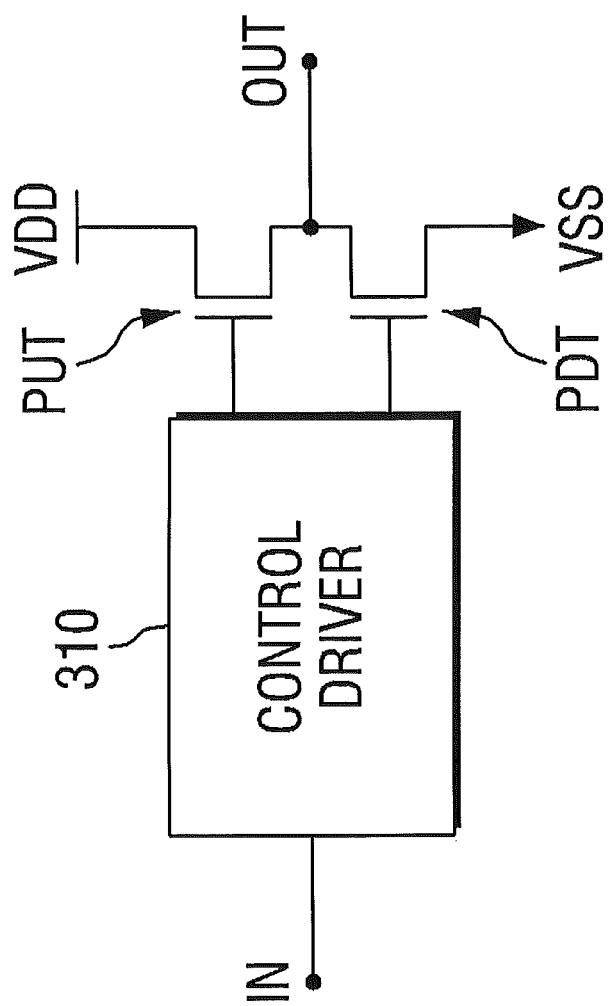
FIG. 9 is a circuit diagram of a semiconductor device according to some embodiments of the inventive subject matter.

Referring to FIG. 9, the semiconductor device may include an output circuit that receives a signal input at an input terminal IN and outputs a predetermined voltage level at an output terminal OUT. The signal input at the input terminal IN may be input to a control driver 310, shifted to a predetermined voltage level by the control driver 310, and then input to gate electrodes of a pull-up transistor PUT and a pull-down transistor PDT. In some embodiments of the inventive subject matter, the pull-up transistor PUT may be, for example, an NMOS transistor. In some other embodiments of the inventive subject matter, both of the pull-up transistor PUT and the pull-down transistor PDT may be, for example, NMOS transistors. The pull-up transistor PUT formed as an NMOS transistor may include at least one of the DMOS transistors according to the above-described embodiments of the inventive subject matter. When both the pull-up transistor PUT and the pull-down transistor PDT are NMOS transistors, the control driver 310 may include an additional circuit for inputting a pull-up signal and a pull-down signal to the pull-up transistor PUT and the pull-down transistor PDT, respectively.

A drain of the pull-up transistor PUT may be connected to a high-level voltage node Vdd, and a source of the pull-down transistor PDT may be connected to a low-level voltage node Vss. A source of the pull-up transistor PUT and a drain of the pull-down transistor may be connected to the output terminal OUT to output predetermined voltage levels.

When the control driver 310 outputs the pull-up signal, the pull-down transistor PDT is turned off while the pull-up transistor PUT is tuned on. Accordingly, the output circuit may output the high-level voltage Vdd. On the other hand, when the control driver 310 outputs the pull-down signal, the pull-up transistor PUT is turned off while the pull-down transistor PDT is turned on. Accordingly, the output circuit may output the low-level voltage Vss.

A semiconductor device including such an output circuit may be, but is not limited to, a power management integrated circuit (PMIC).

Hereinafter, semiconductor systems using semiconductor devices according to the above-described embodiments of the inventive subject matter will be described with reference to FIGS. 10 through 13.

Figure 10:
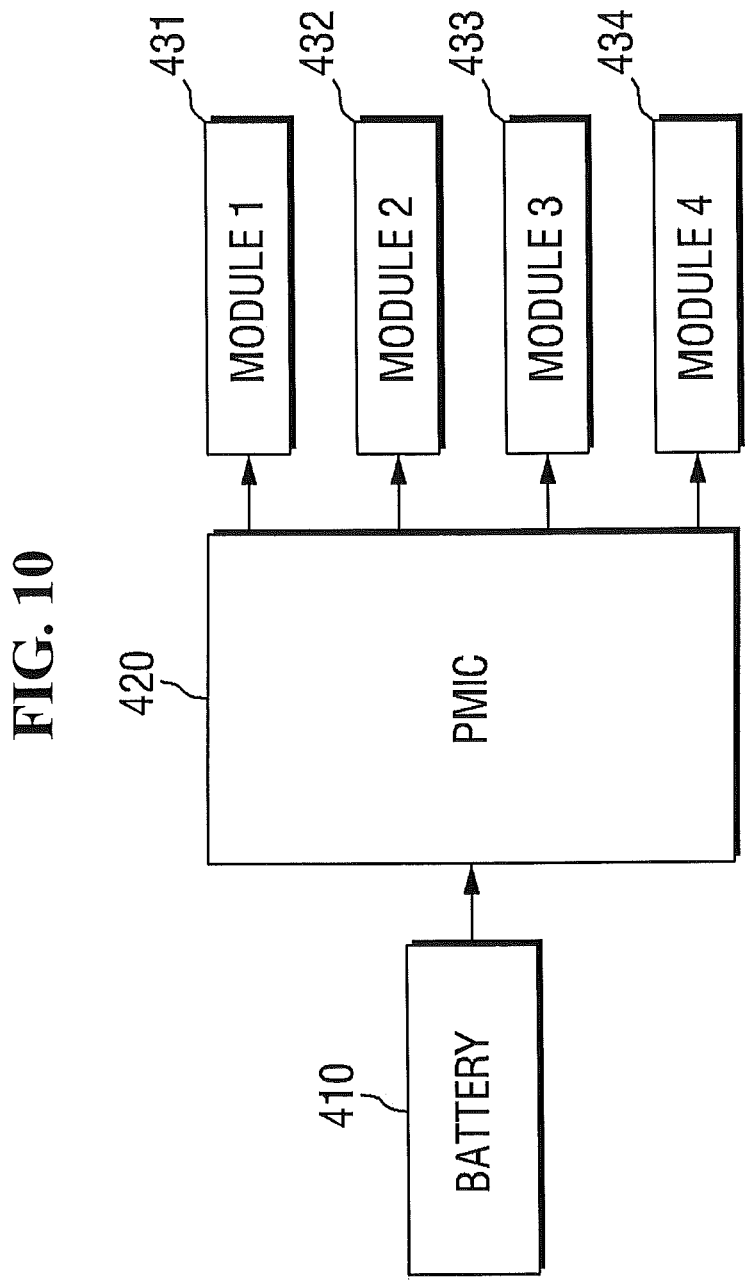
FIG. 10 is a block diagram of a semiconductor system according to some embodiments of the inventive subject matter.

FIG. 10 is a block diagram of a semiconductor system according to some embodiments of the inventive subject matter.

Referring to FIG. 10, a semiconductor system according to some embodiments of the inventive subject matter may include a battery 410, a PMIC 420, and a plurality of modules 431 through 434. The PMIC 420 receives a voltage from the battery 410, shifts the received voltage to a desired voltage level for each of the modules 431 through 434, and provides the voltage at the desired voltage level to each of the modules 431 through 434. The PMIC 420 may include at least one semiconductor device according to the above-described embodiments of the inventive subject matter.

Figure 11:
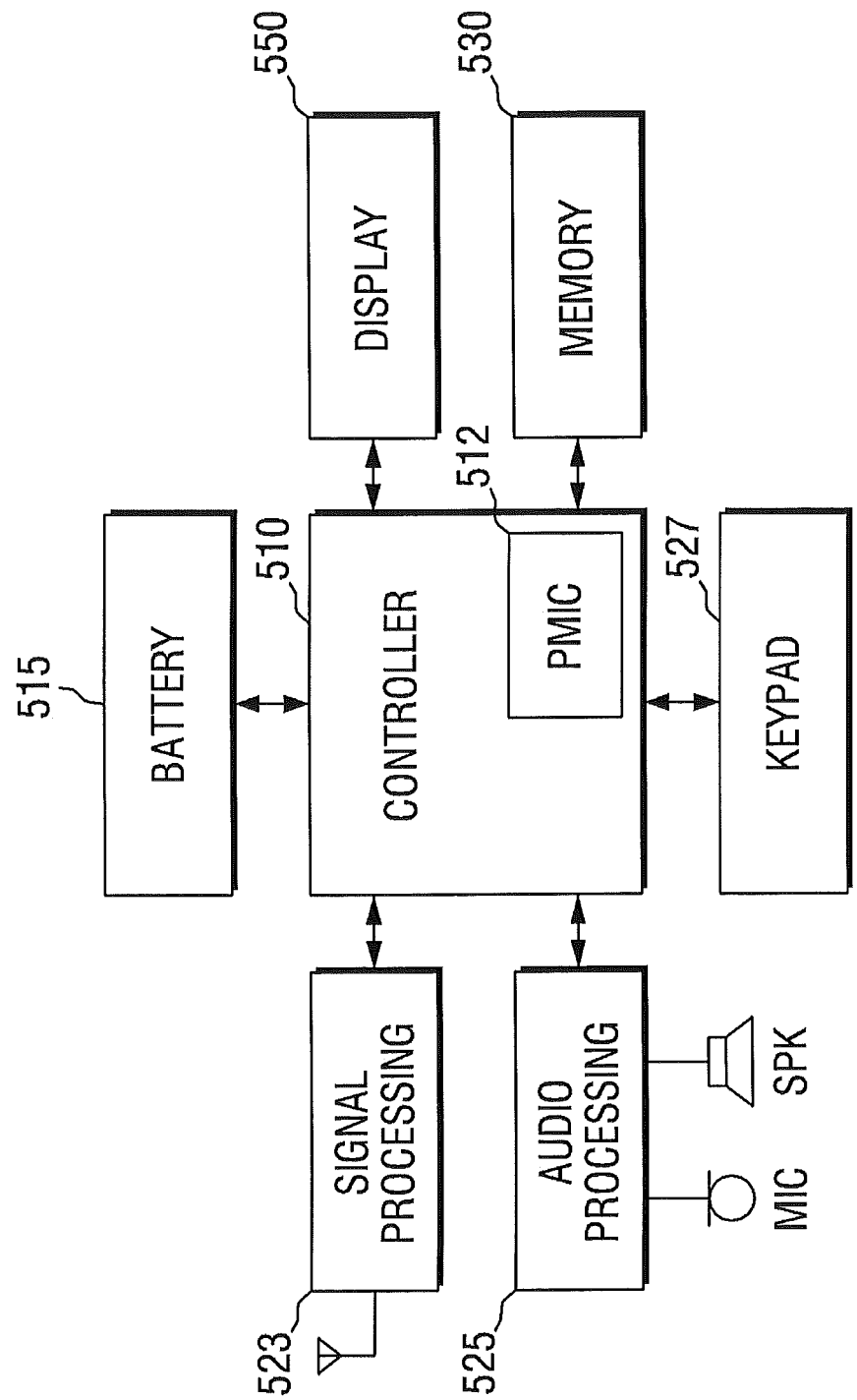
FIG. 11 is a block diagram of a semiconductor system according to some embodiments of the inventive subject matter.

FIG. 11 is a block diagram of a semiconductor system according to some embodiments of the inventive subject matter.

Referring to FIG. 11, the semiconductor system according to the illustrated embodiments may be a portable terminal. The portable terminal may include a controller 510, a PMIC 512, a battery 515, a signal processing unit 523, an audio processing unit 525, a memory 530, and a display 550.

A keypad 527 includes keys for inputting numbers and text information and function keys for setting various functions.

The signal processing unit 523 performs a wireless communication function of the portable terminal and includes a radio frequency (RF) unit and a modem. The RF unit includes an RF transmitter which raises and amplifies the frequency of a transmitted signal and an RF receiver which low-noise amplifies a received signal and lowers the frequency of the received signal. The modem includes a transmitter which encodes and modulates a transmitted signal and a receiver which demodulates and decodes a received signal.

The audio processing unit 525 may include codec. The codec includes data codec and audio codec. The data codec processes packet data, and the audio codec processes audio signals such as sound and multimedia files. The audio processing unit 525 converts a digital audio signal received through the modem into an analog signal using the audio codec and reproduces the analog signal or converts an analog audio signal generated by a microphone into a digital audio signal using the audio code and transmits the digital audio signal to the modem. The code may be provided as a separate element or may be included in the controller 510 of the portable terminal.

The memory 530 includes a read-only memory (ROM) and a random access memory (RAM). The memory 530 may include a program memory and a data memory. The memory 530 may store programs for controlling the operation of the portable terminal and data necessary for booting the portable terminal.

The display 550 displays an image signal and user data on the screen or displays data related to calls. The display 550 may be a liquid crystal display (LCD) or an organic light-emitting diode (OLED). When the LCD or the OLED is implemented as a touch screen, the display 550 may operate as an input unit for controlling the portable terminal, together with the keypad 527.

The controller 510 controls the overall operation of the portable terminal. The controller 510 may include the PMIC 512. The PMIC 512 receives a voltage from the battery 515 and shifts the received voltage to a desired voltage level. The PMIC 512 may include at least one semiconductor device according to the above-described embodiments of the inventive subject matter.

Figure 12:
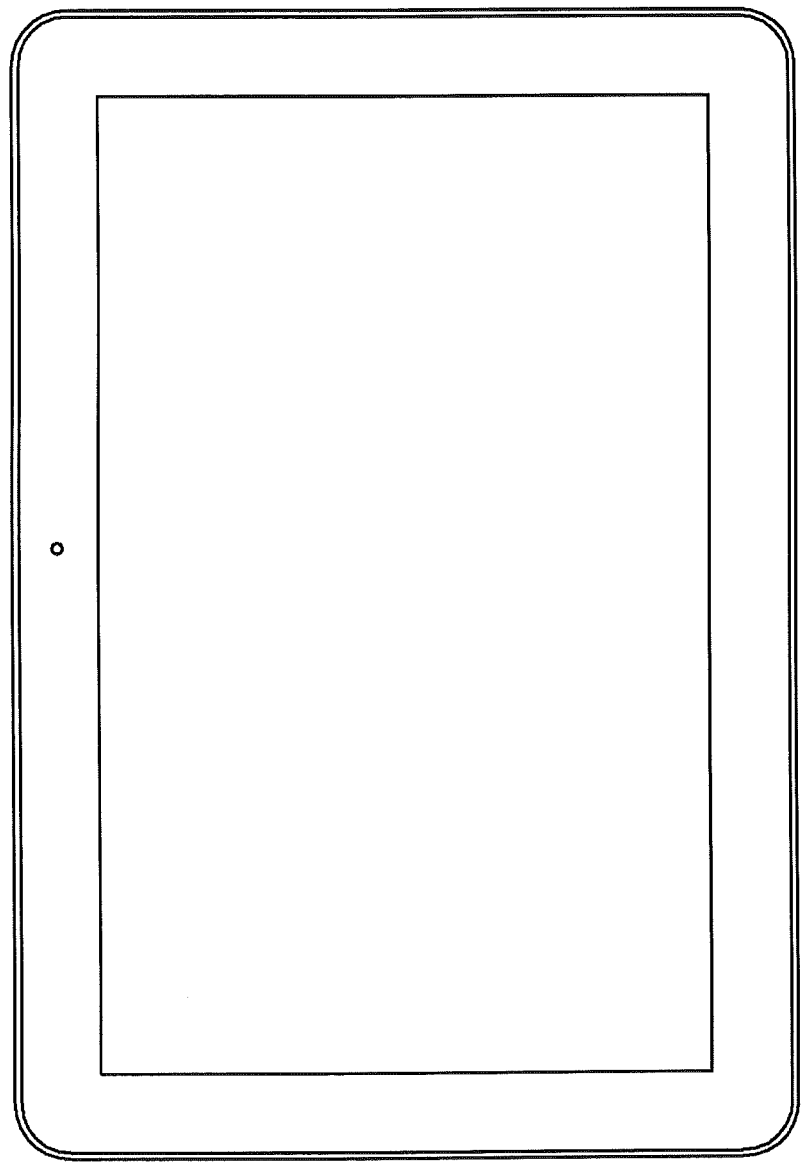
FIGS. 12 and 13 are conceptual diagrams of semiconductor systems according to other embodiments of the inventive subject matter.
Figure 13:
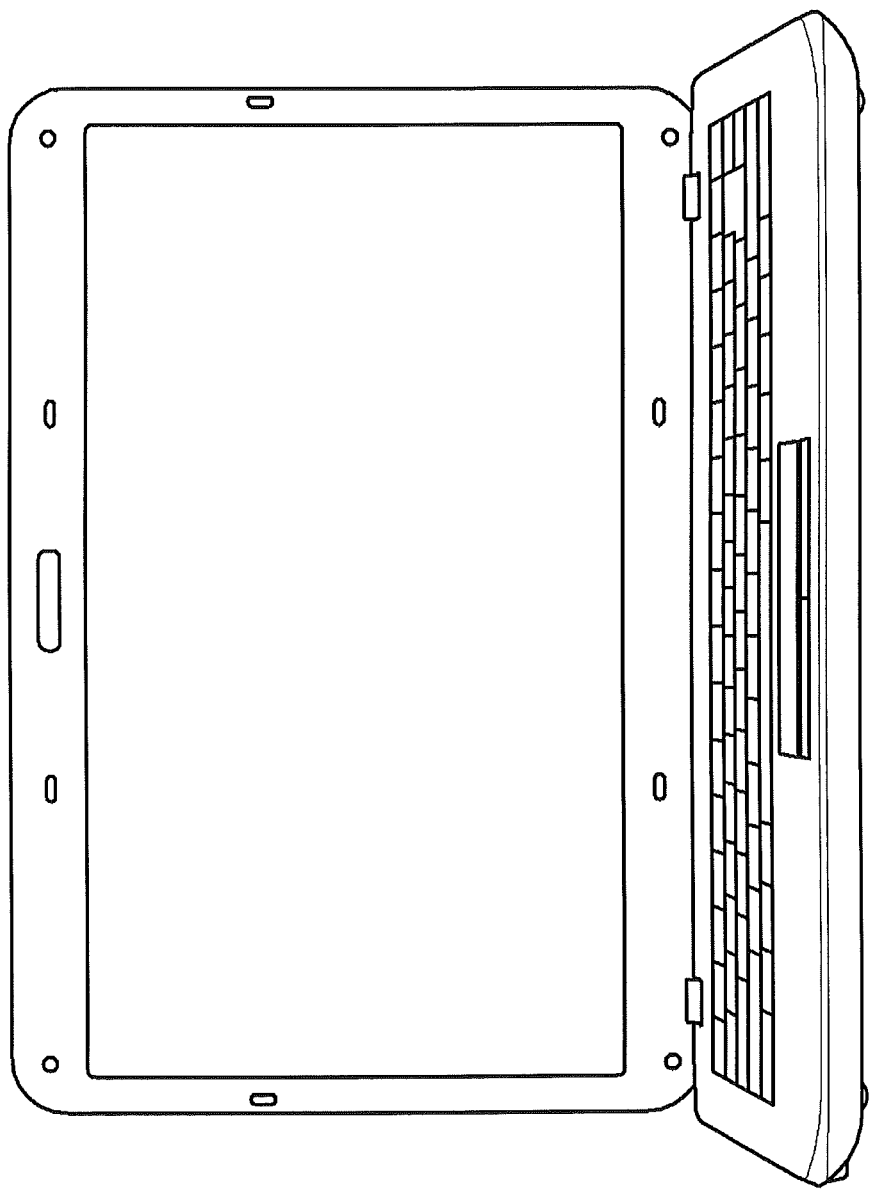

FIGS. 12 and 13 are conceptual diagrams of semiconductor systems according to other embodiments of the inventive subject matter.

FIG. 12 shows a tablet PC, and FIG. 13 shows a notebook computer. At least one semiconductor device according to the above-described embodiments of the inventive subject matter can be used in a tablet PC, a notebook computer, and the like. It is obvious to those of ordinary skill in the art that the semiconductor devices according to the above-described embodiments of the inventive subject matter are applicable to other integrated circuit devices not exemplified herein.

In concluding the detailed description, those skilled in the art will appreciate that many variations and modifications can be made to the preferred embodiments without substantially departing from the principles of the inventive subject matter. Therefore, the disclosed preferred embodiments of the invention are used in a generic and descriptive sense only and not for purposes of limitation.

What is claimed is:

1. A semiconductor device comprising:
a semiconductor substrate of a first conductivity type;
a buried layer of a second conductivity type different from the first conductivity type on the substrate;
an epitaxial layer of the second conductivity type on the buried layer;
a pocket well of the first conductivity type in the epitaxial layer;
a first drift region in the epitaxial layer at least partially overlapping the pocket well;
a second drift region in the epitaxial layer and spaced apart from the first drift region;
a body region of the first conductivity type in the pocket well; and
a gate electrode on the body region, the pocket well and the first drift region and having an edge overlying the epitaxial region between the first and second drift regions.

2. The semiconductor device of claim 1, wherein the gate electrode overlaps the body region and the first drift region but does not overlap the second drift region.

3. The semiconductor device of claim 1, wherein the second drift region does not overlap the pocket well.

4. The semiconductor device of claim 3, further comprising a well of the second conductivity type in the second drift region and a drain region in the well of the second conductivity type.

5. The semiconductor device of claim 1, further comprising a source region in the body region and wherein the gate electrode is disposed on the body region.

6. The semiconductor device of claim 1, wherein the second drift region is separated from the first drift region in a first direction, and wherein the first drift region comprises at least two regions separated in a second direction different from the first direction.

7. The semiconductor device of claim 6, wherein the second drift region comprises at least two regions separated in the second direction.

8. The semiconductor device of claim 1, further comprising a third drift region in the epitaxial layer and separated from the first and second drift regions.

9. The semiconductor device of claim 8, wherein the third drift region is disposed between the first and second drift regions, and wherein the gate electrode does not overlap the second and third drift regions.

10. The semiconductor device of claim 1, further comprising an element isolation film in the epitaxial layer between the first and second drift regions.

11. The semiconductor device of claim 10, wherein the edge of the gate electrode is disposed on the element isolation film.

12. The semiconductor device of claim 1, wherein the first conductivity type comprises a P type, and wherein the second conductivity type comprises an N type.

13. A semiconductor device comprising:
a semiconductor substrate having an epitaxial layer;
a first drift region in the epitaxial layer;
a second drift region in the epitaxial layer and spaced apart from the first drift region;
a source region of a first conductivity type impurity and a drain region of the first conductivity type impurity on the semiconductor substrate;
a gate electrode between the source region and the drain region; and
wherein the drain region is formed in the second drift region, and the epitaxial layer has a valley region which has a lower impurity concentration than the first and second drift regions.

14. The semiconductor device of claim 13, wherein the drift region has a a connection region and the valley region is formed below the connection region between the first and second drift regions.

15. The semiconductor device of claim 13, further comprising an isolation film on the first and second drift regions.

16. The semiconductor device of claim 13, further comprising a buried layer in the epitaxial layer.

17. The semiconductor device of claim 13, further comprising a high-voltage pocket well formed in the epitaxial layer.

18. A semiconductor device comprising:
a semiconductor substrate;
a buried layer on the substrate;
an epitaxial layer on the buried layer;
a pocket well in the epitaxial layer;
a first drift region in the epitaxial layer at partially overlapping the pocket well;
a second drift region in the epitaxial layer and spaced apart from the first drift region;
a body region in the pocket well; and
a gate electrode overlapping the body region and one of the first and second drift regions.

19. The semiconductor device of claim 18, further comprising at least one isolation region disposed in the epitaxial layer between the first and second drift regions.

20. The semiconductor device of claim 19, wherein the at least one isolation region comprises a first isolation region extending between the second drift region and the first drift region and wherein the gate electrode has an edge overlying the first isolation region between the first and second drift regions.

* * * * *